United States Patent
Kim et al.

(10) Patent No.: US 9,490,068 B2
(45) Date of Patent: Nov. 8, 2016

(54) MULTILAYER CERAMIC ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Kyeong Jun Kim, Suwon-Si (KR); Ji Hee Moon, Suwon-Si (KR); Seung Yul Lee, Suwon-Si (KR); Sun Cheol Lee, Suwon-Si (KR); Jang Hyun Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/984,328

(22) Filed: Dec. 30, 2015

(65) Prior Publication Data
US 2016/0240310 A1 Aug. 18, 2016

(30) Foreign Application Priority Data
Feb. 13, 2015 (KR) ........................ 10-2015-0022131

(51) Int. Cl.
| | |
|---|---|
| *H01G 4/005* | (2006.01) |
| *H01G 4/30* | (2006.01) |
| *H01G 4/228* | (2006.01) |
| *H01G 4/20* | (2006.01) |
| *H01G 4/012* | (2006.01) |
| *H01G 4/12* | (2006.01) |
| *H01G 4/248* | (2006.01) |

(Continued)

(52) U.S. Cl.
CPC ................ *H01G 4/012* (2013.01); *H01G 4/12* (2013.01); *H01G 4/248* (2013.01); *H01G 4/30* (2013.01); *H05K 1/111* (2013.01); *H05K 1/181* (2013.01)

(58) Field of Classification Search
CPC ........ H01G 4/012; H01G 4/12; H01G 4/248; H01G 4/30; H05K 1/181; H05K 1/111
USPC .......................... 361/301.4, 303, 306.3, 312
See application file for complete search history.

(56) References Cited

U.S. PATENT DOCUMENTS

| | | | |
|---|---|---|---|
| 2010/0220426 A1* | 9/2010 | Shimizu | H01G 4/30 361/306.3 |
| 2013/0033154 A1* | 2/2013 | Sakuratani | H01G 4/30 310/366 |

(Continued)

FOREIGN PATENT DOCUMENTS

| | | |
|---|---|---|
| JP | 2000-012377 A | 1/2000 |
| JP | 2013-093374 A | 5/2013 |

*Primary Examiner* — Sherman Ng
(74) *Attorney, Agent, or Firm* — McDermott Will & Emery LLP

(57) ABSTRACT

A multilayer ceramic electronic component includes a capacitance forming part in which a plurality of first and second dielectric layers are alternately disposed. The capacitance forming part includes first and second internal electrodes disposed to be spaced apart from each other. First floating electrodes are disposed to be spaced apart from the first and second internal electrodes on the plurality of first dielectric layers, and second floating electrodes are disposed on the plurality of second dielectric layers and partially overlap the first and second internal electrodes. The ceramic body further includes a protective part having a plurality of third dielectric layers on which first and second dummy electrodes are disposed and a plurality of third dummy electrodes are disposed between the first and second dummy electrodes.

14 Claims, 3 Drawing Sheets

(51) Int. Cl.
*H05K 1/18* (2006.01)
*H05K 1/11* (2006.01)

(56) References Cited

U.S. PATENT DOCUMENTS

2014/0146438 A1* 5/2014 Akazawa ............... H01G 4/012
361/301.4
2014/0293500 A1* 10/2014 Seo ........................ H01G 4/12
361/301.4
2015/0016014 A1* 1/2015 Park ....................... H01G 2/065
361/301.4
2015/0170842 A1* 6/2015 An .......................... H01G 4/30
361/321.2
2015/0179339 A1* 6/2015 Seo ........................ H01G 4/12
361/301.4

* cited by examiner

MULTILAYER CERAMIC ELECTRONIC COMPONENT AND BOARD HAVING THE SAME

CROSS-REFERENCE TO RELATED APPLICATION

This application claims the benefit of priority to Korean Patent Application No. 10-2015-0022131, filed on Feb. 13, 2015 with the Korean Intellectual Property Office, the entirety of which is incorporated herein by reference.

TECHNICAL FIELD

The present disclosure relates to a multilayer ceramic electronic component and a board having the same.

BACKGROUND

As electronic products have been miniaturized, slimmed, and multi-functionalized, miniaturization of electronic components has been required, and electronic components mounted therein have been highly integrated. In accordance with this trend, spaces between the mounted electronic components have decreased significantly.

A multilayer ceramic capacitor is mounted on circuit boards of several electronic products such as display devices such as liquid crystal displays (LCDs), plasma display panels (PDPs), or the like, computers, personal digital assistants (PDAs), mobile phones, and the like, to serve to charge or discharge electricity therein or therefrom.

A multilayer ceramic capacitor (MLCC) may be used as a component in various electronic devices due to advantages such as small size, high capacitance, and ease of mounting.

In a multilayer ceramic capacitor having high voltage and low capacitance characteristics, an internal electrode structure design using floating electrodes has frequently been used in order to implement such characteristics.

However, in the multilayer ceramic capacitor having high voltage and low capacitance characteristics, a reduced number of stacked internal electrodes may cause difficulty in securing bending strength.

SUMMARY

An aspect of the present disclosure provides a multilayer ceramic electronic component capable of securing bending strength while having high capacitance by including a capacitance forming part having floating electrodes and a protective part having dummy electrodes, particularly, floating electrodes and dummy electrodes formed in the center of a ceramic body in a length direction.

According to an aspect of the present disclosure, a multilayer ceramic electronic component includes: a ceramic body including a capacitance forming part in which a plurality of first and second dielectric layers are alternately disposed; and first and second external electrodes disposed on first and second end surfaces of the ceramic body in a length direction of the ceramic body, wherein the capacitance forming part includes first and second internal electrodes disposed to be spaced apart from each other on the plurality of first dielectric layers and exposed to the first and second end surfaces of the ceramic body to thereby be connected to the first and second external electrodes, first floating electrodes disposed to be spaced apart from the first and second internal electrodes on the plurality of first dielectric layers, and second floating electrodes disposed on the plurality of second dielectric layers and partially overlapping the first and second internal electrodes, and the ceramic body further includes a protective part disposed between at least one of upper and lower surfaces of the ceramic body and the capacitance forming part and having a plurality of third dielectric layers on which first and second dummy electrodes exposed to the first and second end surfaces of the ceramic body, respectively, are disposed and a plurality of third dummy electrodes are disposed between the first and second dummy electrodes to be spaced apart from each other.

The plurality of third dummy electrodes may be positioned in a central portion of the ceramic body in the length direction and may be disposed to be spaced apart from the first and second dummy electrodes.

The plurality of third dummy electrodes may be positioned to correspond to the second floating electrode.

The capacitance forming part may further include fourth and fifth dummy electrodes disposed on the plurality of second dielectric layers and exposed to the first and second end surfaces of the ceramic body, respectively, and the second floating electrode may be positioned in a central portion of the ceramic body in the length direction and may be disposed to be spaced apart from the fourth and fifth dummy electrodes.

An interval between the plurality of third dummy electrodes in a thickness direction of the ceramic body may be narrower than an interval between the first and second floating electrodes in the thickness direction of the ceramic body.

The multilayer ceramic electronic component may satisfy $0.01 \times T2 < T1 < 0.5 \times T2$, where T1 is an interval between the plurality of third dummy electrodes in a thickness direction of the ceramic body and T2 is an interval between the first and second floating electrodes in the thickness direction of the ceramic body.

The number of third dummy electrodes disposed on a single third dielectric layer among the plurality of third dielectric layers may be between 2 and 10.

The multilayer ceramic electronic component may satisfy $0.1 \times Tc \leq Td < 0.99 \times Tc$, where Tc is a thickness of the protective part disposed between at least one of the upper and lower surfaces of the ceramic body and the capacitance forming part and Td is a thickness of a region of the protective part in which the first and second dummy electrodes are disposed.

The external electrodes may extend from the end surfaces of the ceramic body to at least one of the upper and lower surfaces of the ceramic body.

The multilayer ceramic electronic component may satisfy $1.1 \times Lc' \leq Lp < 0.95 \times Lc$, where Lp is a distance between ends of outermost third dummy electrodes in the length direction of the ceramic body, Lc' is an interval between the external electrodes extended to be disposed on at least one of the upper and lower surfaces of the ceramic body, and Lc is a length of the ceramic body in the length direction.

The multilayer ceramic electronic component may satisfy $Lm \leq 0.95 \times Lb$, where Lm is an interval from one end surface of the ceramic body to an end of an outermost third dummy electrode adjacent thereto among the plurality of third dummy electrodes and Lb is a length from one end surface of the ceramic body to an edge of the external electrode extended to be disposed on at least one of the upper and lower surfaces of the ceramic body.

The multilayer ceramic electronic component may satisfy $1.1 \times Lb \leq Lp'$, where Lp' is a length of at least one of the first and second internal electrodes in the length direction and Lb is a length from one end surface of the ceramic body to an edge of the external electrode extended to be disposed on at least one of the upper and lower surfaces of the ceramic body.

The multilayer ceramic electronic component may satisfy 0.01×Lc<Lm−Ld, where Lm−Ld is a difference between an interval Lm from one end surface of the ceramic body to an end of an outermost third dummy electrode adjacent thereto among the plurality of third dummy electrodes and a length Ld of at least one of the first and second dummy electrodes in the length direction of the ceramic body, and Lc is a length of the ceramic body in the length direction.

According to another aspect of the present disclosure, a board having a multilayer ceramic electronic component may include: a printed circuit board on which first and second electrode pads are provided; and the multilayer ceramic electronic component as described above, mounted on the printed circuit board.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
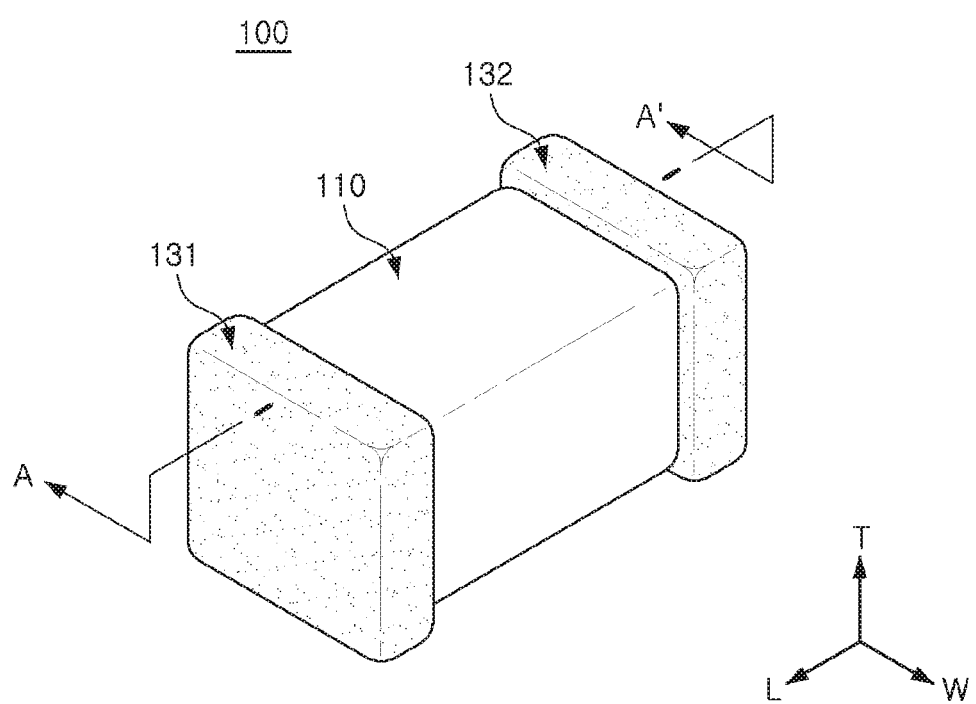
FIG. 1 is a perspective view of a multilayer ceramic electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Examples of multilayer ceramic electronic components include a multilayer ceramic capacitor, an inductor, a piezoelectric element, a varistor, a thermister, or the like. However, hereinafter, a multilayer ceramic capacitor will be described by way of example in an exemplary embodiment.

However, the multilayer ceramic electronic component according to the exemplary embodiment is not limited to the multilayer ceramic capacitor.

FIG. 1 is a perspective view of a multilayer ceramic electronic component according to an exemplary embodiment.

Figure 2:
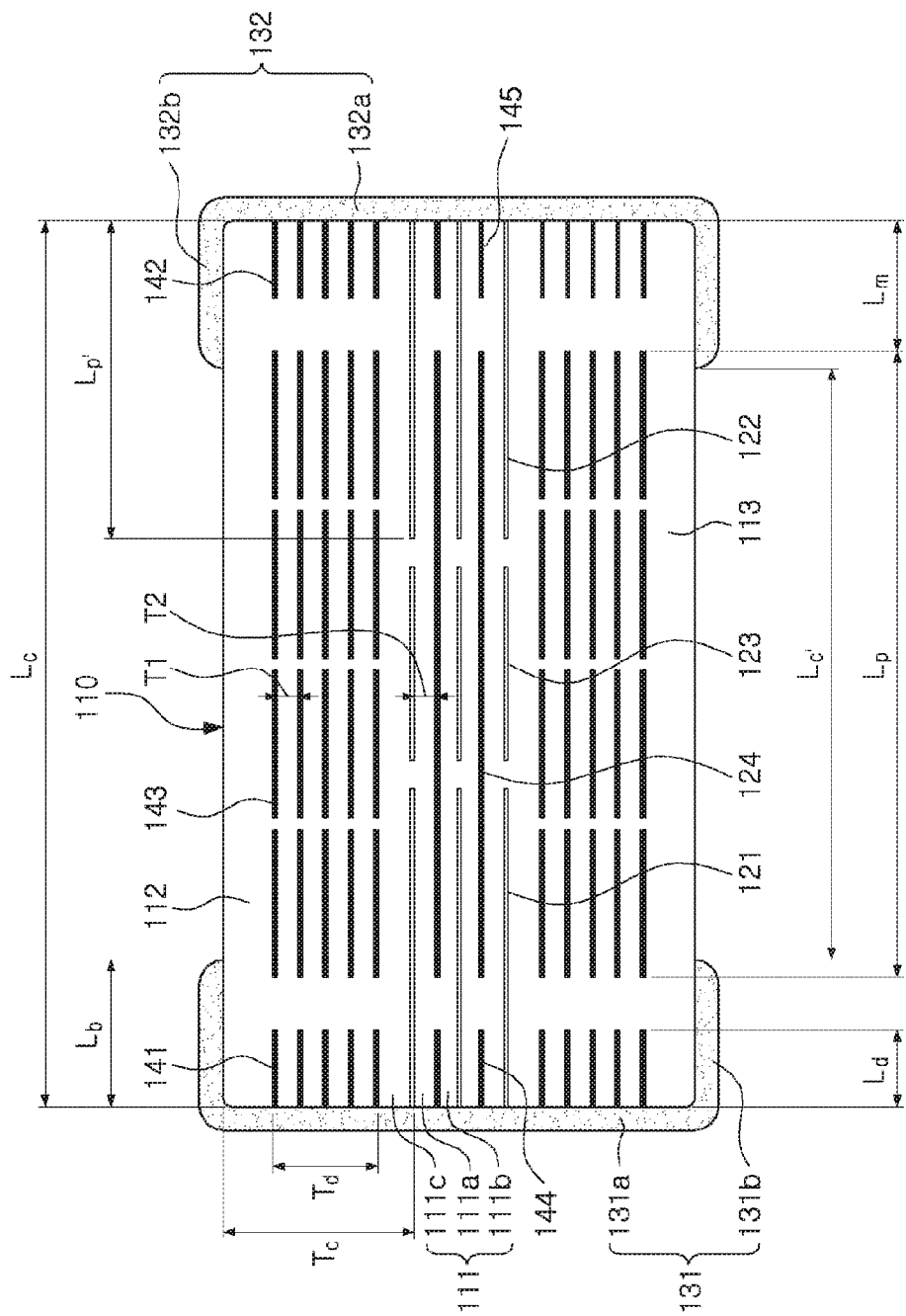
FIG. 2 is a cross-sectional view of the multilayer ceramic electronic component taken along line A-A' of FIG. 1.

FIG. 2 is a cross-sectional view of the multilayer ceramic electronic component taken along line A-A' of FIG. 1.

Referring to FIGS. 1 and 2, the multilayer ceramic electronic component 100, according to the exemplary embodiment, may include a ceramic body 110 and external electrodes 131 and 132.

The ceramic body 110 may be formed by stacking a plurality of dielectric layers 111 (111a, 111b, and 111c) in a thickness direction of the ceramic body 110 and then sintering the stacked dielectric layers. Adjacent dielectric layers may be integrated so that boundaries therebetween are not readily apparent without a scanning electron microscope (SEM).

The ceramic body 110 may have a hexahedral shape.

Directions of the ceramic body 110 will be defined in order to clearly describe the exemplary embodiment. "L," "W," and "T" illustrated in FIG. 1 refer to a length direction, a width direction, and a thickness direction, respectively. Furthermore, the ceramic body 110 may have a lower surface provided as a mounting surface, an upper surface opposing the lower surface, both end surfaces in the length direction, and both side surfaces in the width direction.

Referring to FIG. 2, the ceramic body 110 may include a capacitance forming part formed by alternately disposing a plurality of first and second dielectric layers 111a and 111b.

The ceramic body 110 may include a protective part disposed between at least one of the upper and lower surfaces of the ceramic body 110 and the capacitance forming part and including a plurality of third dielectric layers 111c.

The number of protective parts and a thickness of the protective part in the thickness direction of the ceramic body 110 are not limited to those illustrated in FIG. 2.

Hereinafter, a protective part disposed between the upper surface of the ceramic body 110 and the capacitance forming part will be defined as a first protective part 112, and a protective part disposed between the lower surface of the ceramic body 110 and the capacitance forming part will be defined as a second protective part 113.

The first to third dielectric layers 111a, 111b, and 111c may be formed of a dielectric material, and may improve capacitance of the capacitor.

Further, the first to third dielectric layers 111a, 111b, and 111c may contain a ceramic material having high permittivity, such as a barium titanate ($BaTiO_3$) based ceramic powder, but a material of the first to third dielectric layers 111a, 111b, and 111c is not limited thereto as long as sufficient capacitance may be obtained.

In addition, the first to third dielectric layers 111a, 111b, and 111c may further contain various ceramic additives such as transition metal oxides or carbides, a rare earth element, magnesium (Mg), aluminum (Al), or the like, an organic solvent, a plasticizer, a binder, a dispersant, and the like, in addition to the ceramic powder, as needed.

The capacitance forming part may be formed by alternately disposing the plurality of first and second dielectric layers 111a and 111b.

Referring to FIG. 2, first and second internal electrodes 121 and 122 may be disposed on the plurality of first dielectric layers 111a to be exposed to both end surfaces of the ceramic body 110 in the length direction, respectively.

The first and second internal electrodes 121 and 122 may be electrodes having different polarities from each other, and may be disposed to be spaced apart from each other on the same first dielectric layers 111a as each other.

The capacitance forming part may further include first floating electrodes 123 disposed between the first and second internal electrodes 121 and 122 on the plurality of first dielectric layers 111a to be spaced apart from the first and second internal electrodes 121 and 122.

The first floating electrode 123 may be positioned in a central portion in a cross-section of the ceramic body 110 in a length-thickness direction.

Further, the first floating electrode 123 may be disposed to be spaced apart from each of the first and second internal electrodes 121 and 122 by a predetermined distance.

However, the disposition of the first floating electrode 123 is not limited to that illustrated in FIG. 2, and distances between the first floating electrode 123 and the first internal electrode 121 and between the first floating electrode 123 and the second internal electrode 122 are not necessarily equal to each other.

The first and second internal electrodes 121 and 122 and the first floating electrode 123 may be formed of a conductive metal, such as silver (Ag), lead (Pb), platinum (Pt), nickel (Ni), copper (Cu), and alloys thereof. However, a material of the first and second internal electrodes 121 and 122 and the first floating electrode 123 is not limited thereto.

The first and second internal electrodes 121 and 122 and the first floating electrode 123 may have a rectangular shape, but the shapes of the first and second internal electrodes 121 and 122 and the first floating electrode 123 are not limited thereto. In addition, widths of the first and second internal electrodes 121 and 122 and the first floating electrode 123 are not limited to those illustrated in FIG. 2.

The first floating electrode 123 may be disposed in the central portion of the ceramic body 110 in the length direction to thereby be spaced apart from the first and second internal electrodes 121 and 122 by a predetermined distance.

Meanwhile, second floating electrodes 124 may be formed on the plurality of second dielectric layers 111b to partially overlap the first and second internal electrodes 121 and 122.

In detail, the second floating electrode 124 may be formed in the ceramic body 110 so as not to be exposed outside of the ceramic body 110.

Meanwhile, the second floating electrode 124 may serve to decrease voltage applied to the first and second internal electrodes 121 and 122. Therefore, withstand voltage characteristics may be improved, and the number of stacked first and second internal electrodes 121 and 122 may be increased as long as insulation is not broken.

Further, capacitance may also be formed in portions of the capacitance forming part in which the second floating electrode 124 and the first and second internal electrodes 121 and 122 and the first floating electrode 123 overlap each other.

In view of an equivalent circuit, it may be considered that two capacitors are connected to each other in series, and thus the voltage applied to the first and second internal electrodes 121 and 122 may be decreased by half.

The first and second protective parts 112 and 113 may be formed by stacking the plurality of third dielectric layers 111c.

In this case, first and second dummy electrodes 141 and 142 may be disposed on the plurality of third dielectric layers 111c.

Further, the first and second protective parts 112 and 113 may further include a plurality of third dummy electrodes 143 disposed between the first and second dummy electrodes 141 and 142 on the plurality of third dielectric layers 111c to be spaced apart from each other.

The first and second protective parts 112 and 113 may be formed by at least two third dielectric layers 111c on which the first to third dummy electrodes 141 to 143 are disposed in the thickness direction of the ceramic body 110.

The first to third dummy electrodes 141 to 143 may be formed in the same direction as that of the first and second internal electrodes 121 and 122.

Further, the first to third dummy electrodes 141 to 143 may not contribute to forming capacitance except for parasitic capacitance generated by effects of the external electrodes 131 and 132 disposed on both end surfaces of the ceramic body 110 in the length direction or the capacitance forming part.

In particular, the plurality of third dummy electrodes 143 may be disposed on the third dielectric layer 111c to be spaced apart from the first and second dummy electrodes 141 and 142 by a predetermined distance, and may be formed to be positioned in the central portion of the cross section of the ceramic body 110 in the length-thickness direction.

The plurality of third dummy electrodes 143 may be disposed in the center of the ceramic body 110 in the length direction, and thus bending strength may be increased.

Therefore, a decrease in strength caused by a step problem that may occur due to the stacking of dummy electrodes disposed in order to increase bending strength of a multilayer ceramic capacitor with the small number of stacked internal electrodes may be prevented.

Meanwhile, according to the exemplary embodiment, the plurality of third dummy electrodes 143 may be disposed to be spaced apart from each other, and the number of third dummy electrodes 143 disposed on a single third dielectric layer among the plurality of third dielectric layers 111c may be between two and ten.

Two to ten third dummy electrodes 143 may be positioned in the center of the ceramic body 110 in the length direction, and thus bending strength may be increased.

When the plurality of third dummy electrodes 143 are not positioned in the center of the ceramic body 110 in the length direction, an effect of increasing bending strength may become deteriorated.

When the number of third dummy electrodes 143 is more than 10, cracks, or the like, may occur, and thus reliability of the multilayer ceramic electronic component may become deteriorated.

The plurality of third dummy electrodes 143 may be positioned to correspond to the second floating electrode 124.

The plurality of third dummy electrodes 143 and second floating electrodes 124 may be positioned in the center of the ceramic body 110 in the length direction, and thus the decrease in strength caused by the step problem that may occur due to the stacking of the dummy electrodes may be prevented.

Meanwhile, a plurality of fourth and fifth dummy electrodes 144 and 145 may be disposed in the capacitance forming part.

The capacitance forming part may further include the fourth and fifth dummy electrodes 144 and 145 disposed on the plurality of second dielectric layers 111b.

The fourth and fifth dummy electrodes 144 and 145 may be exposed to both end surfaces of the ceramic body 110 in the length direction, respectively, on the plurality of second dielectric layers 111b on which the second floating electrode 124 is formed, thereby being electrically connected to the external electrodes 131 and 132.

The fourth and fifth dummy electrodes 144 and 145 may be formed to overlap the first and second internal electrodes 121 and 122, respectively, and the second floating electrode 124 may be disposed between the fourth and fifth dummy electrodes 144 and 145 to be spaced apart from the fourth and fifth dummy electrodes 144 and 145 by a predetermined distance.

The second floating electrodes 124 and the fourth and fifth dummy electrodes 144 and 145 may have a rectangular shape, but the shapes of the second floating electrodes 124 and the fourth and fifth dummy electrodes 144 and 145 are not limited thereto.

Further, lengths of the second floating electrodes 124 and the fourth and fifth dummy electrodes 144 and 145 are not limited to those illustrated in FIG. 2.

However, the second floating electrode 124 may be sufficiently long in the length direction of the ceramic body 110 so that the second floating electrode 124 may partially overlap the first and second internal electrodes 121 and 122, respectively.

The fourth and fifth dummy electrodes 144 and 145 as described above may decrease vibrations generated in the external electrodes 131 and 132 disposed on both end surfaces of the ceramic body 110 in the length direction and decrease acoustic noise.

The external electrodes 131 and 132 may be disposed on both end surfaces of the ceramic body 110 in the length direction.

The first and second external electrodes 131 and 132 may be electrically connected to the first and second internal electrodes 121 and 122, respectively.

The first and second external electrodes 131 and 132 as described above may be formed of a conductive metal, such as silver (Ag), lead (Pb), platinum (Pt), nickel (Ni), copper (Cu), and alloys thereof, but a material of the first and second external electrodes 131 and 132 is not limited thereto.

The first and second external electrodes 131 and 132 may extend from both end surfaces of the ceramic body 110 in the length direction to at least one of the upper and lower surfaces of the ceramic body 110 and both side surfaces thereof in the width direction.

That is, the first and second external electrodes 131 and 132 may be distinguished into portions 131a and 132a disposed on both end surfaces of the ceramic body 110 in the length direction and portions 131b and 132b extended to be disposed on at least one of the upper and lower surfaces of the ceramic body 110 and both side surfaces thereof in the width direction.

Meanwhile, plating layers (not illustrated) may be formed on the first and second external electrodes 131 and 132.

The plating layers may include nickel (Ni) plating layers formed on the first and second external electrodes 131 and 132 and tin (Sn) plating layers formed on the nickel plating layers.

The first and second plating layers as described above may increase adhesive strength between the multilayer ceramic electronic component and a printed circuit board when the multilayer ceramic electronic component is mounted on the printed circuit board by solder, or the like. The plating may be performed by a method known in the art, such as a lead-free plating method, but a plating method is not limited thereto.

An interval between the plurality of third dummy electrodes 143 in the thickness direction of the ceramic body 110 may be narrower than an interval between the first and second floating electrodes 123 and 124 in the thickness direction of the ceramic body 110.

In more detail, when the interval between the plurality of third dummy electrodes 143 in the thickness direction of the ceramic body 110 is defined as T1, and the interval between the first and second floating electrodes 123 and 124 in the thickness direction of the ceramic body 110 is defined as T2, $0.01 \times T2 < T1 < 0.5 \times T2$ may be satisfied.

In more detail, bending strength of the multilayer ceramic capacitor with the small number of stacked internal electrodes may be increased by adjusting the interval T1 between the plurality of third dummy electrodes 143 in the thickness direction of the ceramic body 110 and the interval T2 between the first and second floating electrodes 123 and 124 in the thickness direction of the ceramic body 110 to satisfy $0.01 \times T2 < T1 < 0.5 \times T2$.

According to the exemplary embodiment, a thickness Tc of the protective part disposed between at least one of the upper and lower surfaces of the ceramic body 110 and the capacitance forming part and a thickness Td of a region of the protective part in which the first and second dummy electrodes 141 and 142 are disposed may satisfy $0.1 \times Tc \leq Td < 0.99 \times Tc$.

The bending strength of the multilayer ceramic capacitor with the small number of stacked internal electrodes may be improved and adhesive strength between the internal electrodes and the external electrodes may be improved by adjusting the thickness Tc of the protective part disposed between at least one of the upper and lower surfaces of the ceramic body 110 and the capacitance forming part and the thickness Td of the region of the protective part in which the first and second dummy electrodes 141 and 142 are disposed to satisfy $0.1 \times Tc \leq Td < 0.99 \times Tc$.

When the thickness Td of the region of the protective part in which the first and second dummy electrodes 141 and 142 are disposed is less than $0.1 \times Tc$, the bending strength of the multilayer ceramic capacitor and adhesive strength between the internal electrodes and the external electrodes may not be improved.

When the thickness Td of the region of the protective part in which the first and second dummy electrodes 141 and 142 are disposed is more than $0.99 \times Tc$, reliability of the multilayer ceramic capacitor may be deteriorated due to a moisture resistance defect, or the like.

According to the exemplary embodiment, a distance Lp between ends of the outermost third dummy electrodes 143 in the length direction of the ceramic body 110, an interval Lc' between the external electrodes 131b and 132b extended to be disposed on at least one of the upper and lower surfaces of the ceramic body 110, and a length Lc of the ceramic body 110 in the length direction may satisfy $1.1 \times Lc' \leq Lp < 0.95 \times Lc$.

That is, the distance Lp between the ends of the outermost third dummy electrodes 143 in the length direction of the ceramic body 110 may be longer than the interval Lc' between the external electrodes 131b and 132b extended to be disposed on at least one of the upper and lower surfaces of the ceramic body 110.

Further, the distance Lp between the ends of the outermost third dummy electrodes 143 in the length direction of the ceramic body 110 may be shorter than the length Lc of the ceramic body 110 in the length direction.

The bending strength of the multilayer ceramic capacitor with the small number of stacked internal electrodes may be improved by adjusting the distance Lp between the ends of the outermost third dummy electrodes 143 in the length direction of the ceramic body 110, the interval Lc' between the external electrodes 131b and 132b extended to be disposed on at least one of the upper and lower surfaces of the ceramic body 110, and the length Lc of the ceramic body 110 in the length direction to satisfy $1.1 \times Lc' \leq Lp < 0.95 \times Lc$.

According to the exemplary embodiment, an interval Lm from one end surface of the ceramic body 110 in the length direction to an end of the outermost third dummy electrode 143 adjacent thereto among the plurality of third dummy electrodes 143 and a length Lb from one end surface of the ceramic body 110 in the length direction to an edge of the external electrode 131b or 132b extended to be disposed on at least one of the upper and lower surfaces of the ceramic body 110 may satisfy Lm≤0.95×Lb.

That is, the third dummy electrode 143 may be disposed in the center of the ceramic body 110 in the length direction, but the end of the outermost third dummy electrode 143 may be disposed to be closer to both end surfaces of the ceramic body 110 as compared with the edge of the external electrode 131b or 132b extended to be disposed on at least one of the upper and lower surfaces of the ceramic body 110.

At the same time, the ends of the outermost third dummy electrodes 143 may be disposed to be spaced apart from the first and second dummy electrodes 141 and 142 by a predetermined distance.

The bending strength of the multilayer ceramic capacitor with the small number of stacked internal electrodes may be improved by adjusting the interval Lm from one end surface of the ceramic body 110 in the length direction to the end of the outermost third dummy electrode 143 adjacent thereto among the plurality of third dummy electrodes 143 and the length Lb from one end surface of the ceramic body 110 in the length direction to the edge of the external electrode 131b or 132b extended to be disposed on at least one of the upper and lower surfaces of the ceramic body 110 to satisfy Lm≤0.95×Lb.

A length Lp' of at least one of the first and second internal electrodes 121 and 122 in the length direction of the ceramic body 110 and the length Lb from one end surface of the ceramic body 110 in the length direction to the edge of the external electrode 131b or 132b extended to be disposed on at least one of the upper and lower surfaces of the ceramic body 110 may satisfy 1.1×Lb≤Lp'.

The bending strength of the multilayer ceramic capacitor with the small number of stacked internal electrodes may be improved by adjusting the length Lp' of at least one of the first and second internal electrodes 121 and 122 in the length direction of the ceramic body 110 and the length Lb from one end surface of the ceramic body 110 in the length direction to the edge of the external electrode 131b or 132b extended to be disposed on at least one of the upper and lower surfaces of the ceramic body 110 to satisfy 1.1×Lb≤Lp'.

Further, a difference Lm−Ld between the interval Lm from one end surface of the ceramic body 110 in the length direction to the end of the outermost third dummy electrode 143 adjacent thereto among the plurality of third dummy electrodes 143 and a length Ld of at least one of the first and second dummy electrodes 141 and 142 in the length direction of the ceramic body 110, and the length Lc of the ceramic body 110 in the length direction may satisfy 0.01×Lc<Lm−Ld.

The bending strength of the multilayer ceramic capacitor with the small number of stacked internal electrodes may be improved by adjusting the difference Lm−Ld between the interval Lm from one end surface of the ceramic body 110 in the length direction to the end of the outermost third dummy electrode 143 adjacent thereto and the length Ld of at least one of the first and second dummy electrodes 141 and 142 in the length direction of the ceramic body 110, and the length Lc of the ceramic body 110 in the length direction to satisfy 0.01×Lc<Lm−Ld.

Board Having Multilayer Ceramic Electronic Component

Figure 3:
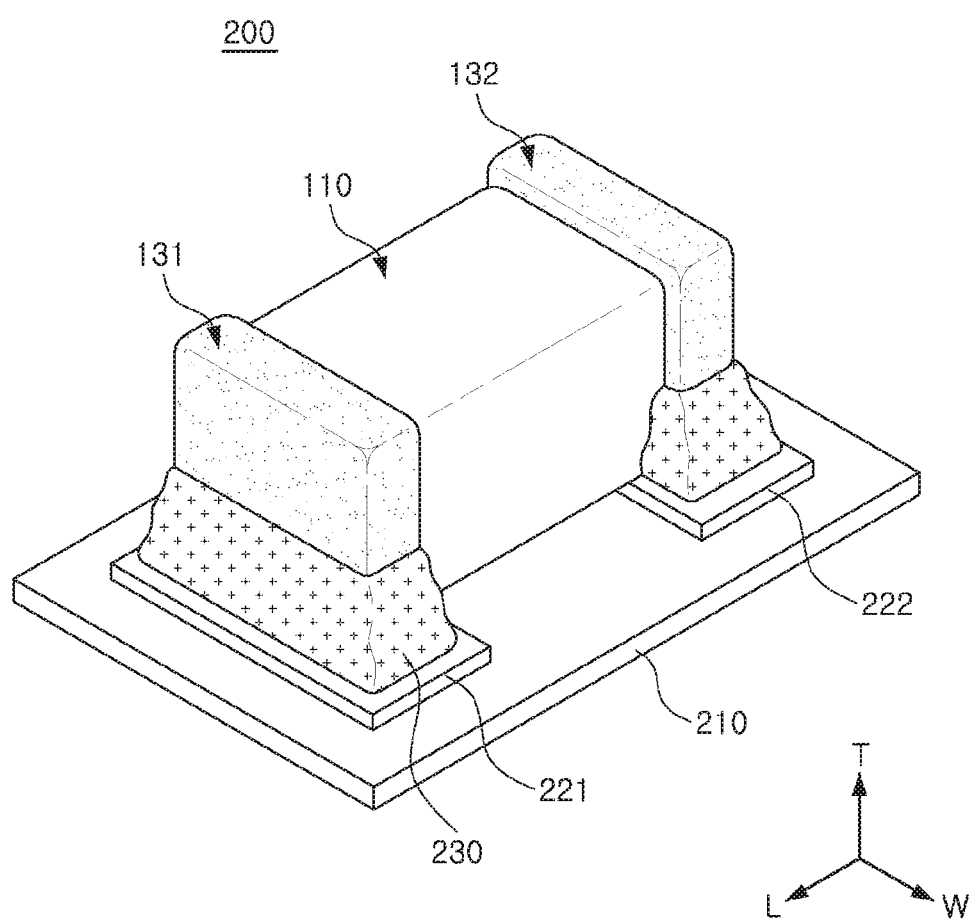
FIG. 3 is a perspective view of a board in which the multilayer ceramic electronic component of FIG. 1 is mounted on a printed circuit board.

FIG. 3 is a perspective view of a board in which the multilayer ceramic electronic component of FIG. 1 is mounted on a printed circuit board.

Referring to FIG. 3, a board 200 having a multilayer ceramic electronic component 100, according to the present exemplary embodiment, may include a printed circuit board 210 on which the multilayer ceramic electronic component 100 is mounted and first and second electrode pads 221 and 222 formed on the printed circuit board 210 to be spaced apart from each other.

The multilayer ceramic electronic component 100 may be electrically connected to the printed circuit board 210 by solders 230 in a state in which first and second external electrodes 131 and 132 are positioned to contact the first and second electrode pads 221 and 222, respectively.

Except for the description described above, a description of features overlapping those of the multilayer ceramic capacitor according to the previous embodiment described above will be omitted.

As set forth above, according to exemplary embodiments, the multilayer ceramic electronic component may include the capacitance forming part having the floating electrodes and the protective part having the dummy electrodes, whereby the bending strength of the multilayer ceramic electronic component may be improved.

Further, according to exemplary embodiments, the capacitance forming part and the protective part may include the dummy electrodes, and adhesive strength between the internal electrodes and the external electrodes may be improved.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
    a ceramic body including a capacitance forming part in which a plurality of first and second dielectric layers are alternately disposed; and
    first and second external electrodes disposed on first and second end surfaces of the ceramic body in a length direction of the ceramic body, respectively,
    wherein the capacitance forming part includes:
    first and second internal electrodes disposed to be spaced apart from each other on the plurality of first dielectric layers and exposed to the first and second end surfaces of the ceramic body to thereby be connected to the first and second external electrodes, respectively;
    first floating electrodes disposed to be spaced apart from the first and second internal electrodes on the plurality of first dielectric layers; and
    second floating electrodes disposed on the plurality of second dielectric layers and partially overlapping the first and second internal electrodes,
    wherein the ceramic body further includes a protective part disposed between at least one of upper and lower surfaces of the ceramic body and the capacitance forming part and having a plurality of third dielectric layers on which first and second dummy electrodes exposed to the first and second end surfaces of the ceramic body, respectively, are disposed and a plurality of third dummy electrodes are disposed between the first and second dummy electrodes to be spaced apart from each other.

2. The multilayer ceramic electronic component of claim 1, wherein the plurality of third dummy electrodes are positioned in a central portion of the ceramic body in the length direction and disposed to be spaced apart from the first and second dummy electrodes.

3. The multilayer ceramic electronic component of claim 1, wherein the plurality of third dummy electrodes are positioned to correspond to the second floating electrode.

4. The multilayer ceramic electronic component of claim 1, wherein the capacitance forming part further includes fourth and fifth dummy electrodes disposed on the plurality of second dielectric layers and exposed to the first and second end surfaces of the ceramic body, respectively, and
the second floating electrode is positioned in a central portion of the ceramic body in the length direction and disposed to be spaced apart from the fourth and fifth dummy electrodes.

5. The multilayer ceramic electronic component of claim 1, wherein an interval between the plurality of third dummy electrodes in a thickness direction of the ceramic body is narrower than an interval between the first and second floating electrodes in the thickness direction of the ceramic body.

6. The multilayer ceramic electronic component of claim 1, wherein $0.01 \times T2 < T1 < 0.5 \times T2$, where T1 is an interval between the plurality of third dummy electrodes in a thickness direction of the ceramic body and T2 is an interval between the first and second floating electrodes in the thickness direction of the ceramic body.

7. The multilayer ceramic electronic component of claim 1, wherein the number of third dummy electrodes disposed on a single third dielectric layer among the plurality of third dielectric layers is between 2 and 10.

8. The multilayer ceramic electronic component of claim 1, wherein $0.1 \times Tc \leq Td < 0.99 \times Tc$, where Tc is a thickness of the protective part disposed between at least one of the upper and lower surfaces of the ceramic body and the capacitance forming part and Td is a thickness of a region of the protective part in which the first and second dummy electrodes are disposed.

9. The multilayer ceramic electronic component of claim 1, wherein the external electrodes extend from the end surfaces of the ceramic body to at least one of the upper and lower surfaces of the ceramic body.

10. The multilayer ceramic electronic component of claim 9, wherein $1.1 \times Lc' \leq Lp < 0.95 \times Lc$, where Lp is a distance between ends of outermost third dummy electrodes in the length direction of the ceramic body, Lc' is an interval between the external electrodes extended to be disposed on at least one of the upper and lower surfaces of the ceramic body, and Lc is a length of the ceramic body in the length direction.

11. The multilayer ceramic electronic component of claim 9, wherein $Lm \leq 0.95 \times Lb$, where Lm is an interval from one end surface of the ceramic body to an end of an outermost third dummy electrode adjacent thereto among the plurality of third dummy electrodes and Lb is a length from one end surface of the ceramic body to an edge of the external electrode extended to be disposed on at least one of the upper and lower surfaces of the ceramic body.

12. The multilayer ceramic electronic component of claim 9, wherein $1.1 \times Lb \leq Lp'$, where Lp' is a length of at least one of the first and second internal electrodes in the length direction and Lb is a length from one end surface of the ceramic body to an edge of the external electrode extended to be disposed on at least one of the upper and lower surfaces of the ceramic body.

13. The multilayer ceramic electronic component of claim 1, wherein $0.01 \times Lc < Lm - Ld$, where Lm−Ld is a difference between an interval Lm from one end surface of the ceramic body to an end of an outermost third dummy electrode adjacent thereto among the plurality of third dummy electrodes and a length Ld of at least one of the first and second dummy electrodes in the length direction of the ceramic body, and Lc is a length of the ceramic body in the length direction.

14. A board having a multilayer ceramic electronic component comprising:
a printed circuit board on which first and second electrode pads are provided; and
the multilayer ceramic electronic component of claim 1, mounted on the printed circuit board.

* * * * *